(12) United States Patent
Bauer

(10) Patent No.: US 8,421,453 B2
(45) Date of Patent: Apr. 16, 2013

(54) MAGNETIC FIELD SENSOR ARRAY FOR MEASURING SPATIAL COMPONENTS OF A MAGNETIC FIELD

(75) Inventor: Christian Bauer, Schwieberdingen (DE)

(73) Assignee: Robert Bosch GmbH, Stuttgart (DE)

( * ) Notice: Subject to any disclaimer, the term of this patent is extended or adjusted under 35 U.S.C. 154(b) by 772 days.

(21) Appl. No.: 12/554,271

(22) Filed: Sep. 4, 2009

(65) Prior Publication Data

US 2010/0072992 A1    Mar. 25, 2010

(30) Foreign Application Priority Data

Sep. 8, 2008   (DE) .................. 10 2008 041 859

(51) Int. Cl.
*G01R 3/00*    (2006.01)
(52) U.S. Cl.
USPC .......................................... 324/260; 324/252
(58) Field of Classification Search ................. 324/252, 324/260
See application file for complete search history.

(56) References Cited

U.S. PATENT DOCUMENTS 6,166,539 A     12/2000  Dahlberg et al.
6,545,462 B2 *  4/2003   Schott et al. ............... 324/207.2

FOREIGN PATENT DOCUMENTS

| DE | 102006022336 A1 | 9/2007 |
| EP | 1182461 A2 | 2/2002 |
| EP | 1860451 A1 | 11/2007 |
| WO | 2006134520 A1 | 12/2006 |

* cited by examiner

*Primary Examiner* — Reena Aurora
(74) *Attorney, Agent, or Firm* — Michael Best & Friedrich LLP

(57) ABSTRACT

A magnetic field array for measuring spatial components of a magnetic field is proposed, in which with at least one magnetic field sensor utilizing the XMR effect in a magnetoresistive film structure, a further component, perpendicular or nonparallel to the film structure of the magnetic field to be detected, is detectable in that at least one flux concentrator is disposed above the film structure in such a way that the magnetic field lines in the peripheral regions of the flux concentrator are deflectable in such a way that there, the field lines embody a horizontal component of the magnetic field.

13 Claims, 2 Drawing Sheets

MAGNETIC FIELD SENSOR ARRAY FOR MEASURING SPATIAL COMPONENTS OF A MAGNETIC FIELD

CROSS-REFERENCE TO RELATED APPLICATION

This application is based on German Patent Application 10 2008 041 859.5 filed Sep. 8, 2008.

BACKGROUND OF THE INVENTION

1. Field of the Invention

The invention relates to a magnetic field array for measuring spatial components of a magnetic field.

2. Description of the Prior Art

It is generally known that in rpm and position sensors, for instance, such as are used for controlling motors or in transmission or vehicle dynamics controls in motor vehicles, a rotary motion or change of position is detected by means of a magnetic field variation that corresponds to the rotation or the change of position. Then as a rule, magnet sensors known per se are employed, which depending on the application and field of use may be Hall sensors or magnetoresistive sensors.

Besides magnetoresistive structures that are based on the anisotropic magnetic resistance effect (AMR), the more-sensitive giant magnetoresistance structures (GMRs) and tunnel magnetoresistance structures (TMRs) can be named in particular. The various magnetoresistive effects will hereinafter be summarized as XMR effects.

One disadvantage of the sensor arrays with the XMR effect is that in contrast to Hall sensors, they are sensitive to the magnetic flux density in the plane of the magnetoresistive film structures. Such magnetoresistive film structures are thin metal films which are applied to a substrate, in this case in particular a semiconductor chip. A semiconductor chip is preferentially used because it has good substrate properties and because electrical connections or all of the signal processing can be integrated with it.

However, for certain applications, magnetic field measurements in three directions in space are required, in which besides the information about the magnetic flux density in the semiconductor chip plane, information about the component perpendicular to that is required as well.

It is known for instance from European Patent Disclosure EP 1 436 849 B1 that in conventional Hall sensors, which typically measure the magnetic flux density perpendicular to the chip plane, the possibility exists of determining the missing components in the chip plane by means of special vertical Hall elements with lesser sensitivity.

From European Patent Disclosure EP 1 182 461 A2, it is known that in a Hall sensor, with the aid of a flux concentrator, the horizontal field components can be deflected into the vertical direction, so that then the magnetic field can be detected using a conventional Hall element.

However, if the greater magnetic field sensitivity of the magnetic field sensors is to be employed, utilizing the XMR effect, for direct determination of the vertical magnetic field component, then thus far in this respect it can be learned from European Patent Disclosure EP 1 860 451 A1 only that a projection of the vertical magnetic field component onto a beveled substrate face of the semiconductor chip can be detected, which means complicated production of the substrate with precise control of the substrate angle, so that then a conclusion can be drawn about the true vertical magnetic field component.

ADVANTAGES AND SUMMARY OF THE INVENTION

The invention is based on a magnetic field array for measuring spatial components of a magnetic field, in which with at least one magnetic field sensor, utilizing the XMR effect of a magnetoresistive film structure, a further component, preferably perpendicular or nonparallel to the film structure, of the magnetic field to be detected is detectable in that at least one flux concentrator is disposed above the film structure in such a way that the magnetic field lines in the peripheral regions of the flux concentrator are deflectable in such a way that there, the field lines embody a horizontal component of the magnetic field.

Preferably, at least two magnetic field sensors or magnetoresistive films are disposed in the peripheral region of the flux concentrator and are interconnected with two ohmic resistors in a measuring bridge circuit. It is especially advantageous if the at least two magnetic field sensors or magnetoresistive films are disposed on an outer circle, and inside that, under the disklike flux concentrator, at least two further magnetic field sensors or magnetoresistive films are disposed.

It is also advantageous if the reference film magnetization of the magnetoresistive film structure is oriented such that it points radially to the center of the preferably soft-magnetic flux concentrator or alternatively radially away from it.

As embodiments of the magnetic field sensors, AMR sensors, GMR sensors or TMR sensors can be used here, which all utilize what is known as the XMR effect mentioned in the background section.

With the invention it is also further possible that with additional magnetic field sensors or magnetoresistive films, further spatial components of the magnetic field are detectable.

A preferred use of the magnetic field array according to the invention is obtained if the magnetic field array is used in three-dimensional detection of magnetic field lines, in particular in compass applications.

With the invention, it is thus easily possible, for instance by means of a so-called GMR spin valve resistance bridge on a semiconductor chip, to measure the particular component of the magnetic flux density that is oriented perpendicular to the chip plane and thus perpendicular to the plane of the GMR films. In a further step, it is then possible by means of two additional GMR bridges on the chip to implement a simple magnet sensor for the magnetic field measurement in three directions in space.

According to the invention, with the use of a preferably soft-magnetic flux concentrator, which for instance deflects the magnetic field component extending perpendicular to the plane of the GMR film into the chip plane, the high magnetic field sensitivity of the GMR sensors in the plane can be used for detecting that component. In particular, a circular disk geometry of the flux concentrator is suitable for this. The reference magnetization of the GMR film of the magnetic field sensor should be selected such that it always extends perpendicular to the boundary line of the soft-magnetic element, to ensure an optimal measurement effect.

Thus the possibility is attained of measuring preferably the vertical component of the magnetic flux density with a GMR sensor, which until now was possible only with Hall elements. Together with known measurement arrays, such as Wheatstone measuring bridges, for measuring the magnetic field components in the GMR sensor film plane, it is possible at little effort or expense to produce a so-called three-axis magnetic field sensor purely on the basis of GMR sensor structures. This is of interest for example, as already mentioned, for compass applications.

BRIEF DESCRIPTION OF THE DRAWINGS

The invention will be better understood and further objects and advantages thereof will become more apparent from the ensuing detailed description of a preferred embodiment taken in conjunction with the drawings, in which.

DESCRIPTION OF THE PREFERRED EMBODIMENT

Figure 1:
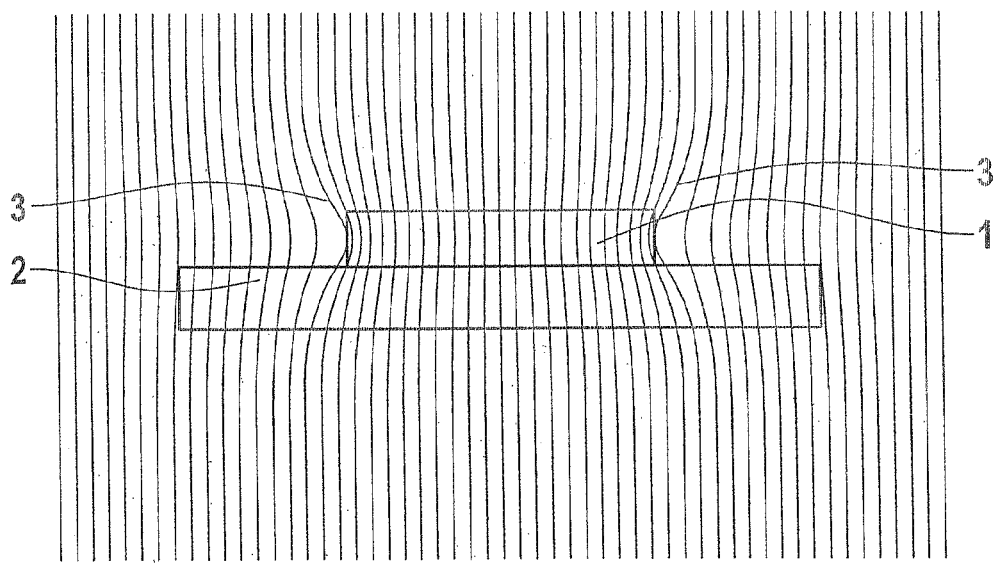
FIG. 1 is a schematic section through a magnetic field array and a flux concentrator, along with the magnetic field lines formed by this arrangement.

A magnetic field array schematically shown in FIG. 1 comprises a soft-magnetic flux concentrator 1, which is located on the surface of a substrate, in this case a semiconductor chip 2, as a carrier of magnetic field sensors, such as GMR sensors. From FIG. 1, it can be seen that field lines 3 of a magnetic field to be detected are for example deflected on the peripheral region of the flux concentrator 1 out of their originally vertical direction into a horizontal direction, so that they become measurable for the magnetic field sensors.

Since the lengths of the field lines 3 in the material comprising the flux concentrator 1 for the vertical-to-horizontal deflection are shorter than the length for the horizontal-to-vertical deflection, the result is admittedly a slight deflection effect, but that can be compensated for by the increased sensitivity of the magnetic field sensors. To enhance the measurement effect, the flux concentrator 1 could possibly be countersunk in a manner not shown here into the substrate film of the semiconductor chip 2.

Figure 2:
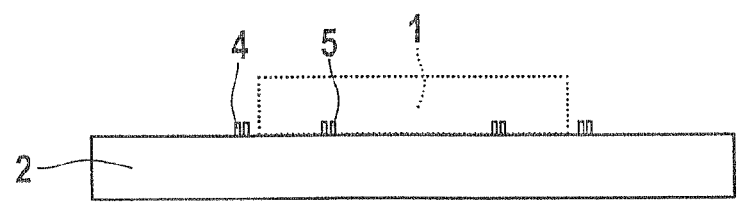
FIGS. 2 and 3 show the magnetic field array of FIG. 1 with circular magnetic field sensors in a side view (FIG. 2) and a top view (FIG. 3)
Figure 3:
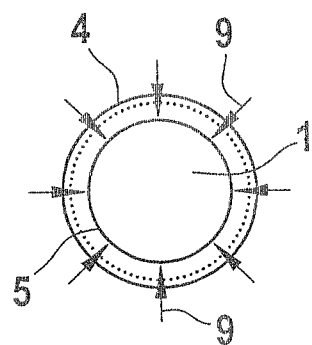
Figure 4:
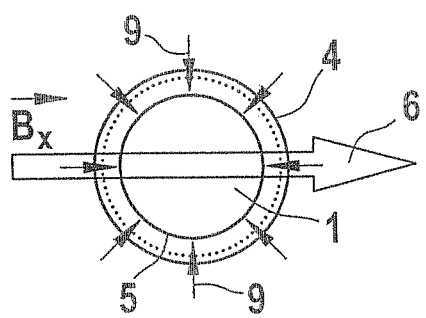
FIG. 4 is a top view corresponding to FIG. 3, showing the field direction of a superimposed field.

From FIG. 2, the magnetic field array or magnetoresistive film structures of FIG. 1 can be seen, with magnetic field sensors 4 (such GMR sensors) disposed on an outer circle and circular magnetic field sensors 5 disposed on the inside between the flux concentrator 1 and the semiconductor chip 2. From FIG. 3, this arrangement can be seen in a top view, with the flux concentrator 1 in this case only outlined in dashed lines. A feature of particular significance here is the orientation of a reference film magnetization 9 of the magnetoresistive GMR film structures. In the ideal case, it points as in FIGS. 3 and 4 always radially to the center point of the flux concentrator 1 or alternatively radially away from it. Only then is it ensured that a superimposed magnetic field in the plane of the semiconductor chip 2, as indicated by the field direction $B_x$ (arrow 6) in FIG. 4, is compensated for. In that case, the increase in resistance of the magnetic field sensors 4, given an antiparallel orientation between the magnetic field to be detected and the direction of magnetization of the reference film on one semicircle, is equal to the reduction in resistance in a parallel orientation of the magnetic field and direction of magnetization on the other semicircle.

To attain this special reference film magnetization 9, a suitable coil arrangement, not shown here, may be provided that generates a radial magnetic field above the GMR circular resistor formed by the magnetic field sensors 4 and 5. Alternatively, after the shaping of the GMR film system with the magnetic field sensors 4 and 5 in the semiconductor chip 2, an inscription of the reference film magnetization can be effected by local heating by means of a laser beam in an outer field. In the process, either the semiconductor chip 2 is rotated in a constant, homogeneous field, or the field is rotated and the laser beam is rotated synchronously via the circular resistor.

Figure 5:
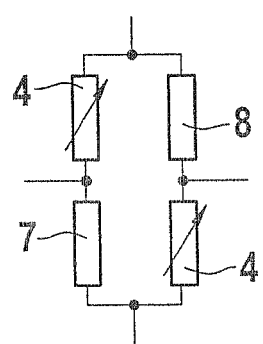
FIG. 5 shows one example of a magnetic field array in a bridge circuit.

The actual measurement of the magnitudes of the magnetic field can then be implemented by means of a bridge circuit of the magnetic field sensors 4 and 5 (for instance, GMR resistors). As shown in FIG. 5, at least two magnetic field sensors 4 are necessary in order to attain a measurement effect. These sensors must be placed close to the edge of the flux concentrator 1, as shown in FIGS. 2 and 3, the two other resistors 7 and 8 may be normal ohmic resistors, whose resistances are adapted to the magnetic field sensors 4 or 5.

To obtain optimal adaptation of resistance, however, it is recommended that instead of the resistors 7 and 8, two further magnetic field sensors 5 be used, although in that case they must be shield from the magnetic field, and therefore are placed below the flux concentrator 1 in the form of inner magnetic field sensors 5.

The foregoing relates to a preferred exemplary embodiment of the invention, it being understood that other variants and embodiments thereof are possible within the spirit and scope of the invention, the latter being defined by the appended claims.

I claim:

1. A magnetic field array for measuring spatial components of a magnetic field, the magnetic field array by means of at least one magnetic field sensor utilizing the XMR effect of a magnetoresistive film structure, a further component, perpendicular or nonparallel to the film structure of the magnetic field to be detected, is detectable in that at least one flux concentrator is disposed above the film structure in such a way that magnetic field lines in peripheral regions of the flux concentrator are deflectable in such a way that there, the field lines embody a horizontal component of the magnetic field, wherein at least two magnetic field sensors are disposed in the peripheral region of the flux concentrator and are interconnected with two resistors in a measuring bridge circuit.

2. The magnetic field array as defined by claim 1, wherein the magnetoresistive film structure comprise thin metal films which are applied to a substrate.

3. The magnetic field array as defined by claim 2, wherein the substrate is a semiconductor chip.

4. The magnetic field array as defined by claim 3, wherein reference film magnetization is attainable in that, after a shaping of the magnetoresistive films, inscription of the reference film magnetization is effected by local heating by means of a laser beam in an outer field, and either the semiconductor chip is rotated in a constant homogeneous field or the field is rotated and the laser beam is rotated synchronously via a circular resistor.

5. The magnetic field array as defined by claim 1, wherein the magnetic field sensors comprise AMR sensors.

6. The magnetic field array as defined by claim 1, wherein the magnetic field sensors comprise GMR sensors.

7. The magnetic field array as defined by claim 1, wherein the magnetic field sensors comprise TMR sensors.

8. The magnetic field array as defined by claim 1, wherein with further magnetic field sensors, further spatial components of the magnetic field are detectable.

9. The magnetic field array as defined by claim 1, wherein the flux concentrator or flux concentrators comprise soft-magnetic flux concentrators.

10. The magnetic field array as defined by claim 1, wherein reference film magnetization is attainable in that with a coil arrangement, a radial magnetic field is generated above a circular resistor formed by the magnetic field sensors.

11. The magnetic field array as defined by claim 1, wherein the magnetic field array is used in three-dimensional detection of magnetic field lines.

12. A magnetic field array for measuring spatial components of a magnetic field, the magnetic field array by means of at least one magnetic field sensor utilizing the XMR effect of a magnetoresistive film structure, a further component, perpendicular or nonparallel to the film structure of the magnetic field to be detected, is detectable in that at least one flux concentrator is disposed above the film structure in such a way that magnetic field lines in peripheral regions of the flux concentrator are deflectable in such a way that there, the field lines embody a horizontal component of the magnetic field, wherein the at least two magnetic field sensors are disposed on an outer circle; and that inside that, under the flux concentrator, at least two further magnetic field sensors are disposed and the at least two and magnetic field sensors and the at least further two further magnetic field sensors are connected in a measuring bridge circuit.

13. A magnetic field array for measuring spatial components of a magnetic field, the magnetic field array by means of at least one magnetic field sensor utilizing the XMR effect of a magnetoresistive film structure, a further component, perpendicular or nonparallel to the film structure of the magnetic field to be detected, is detectable in that at least one flux concentrator is disposed above the film structure in such a way that magnetic field lines in peripheral regions of the flux concentrator are deflectable in such a way that there, the field lines embody a horizontal component of the magnetic field, wherein reference film magnetization of the magnetoresistive film structure is oriented such that it intersects an outer boundary of the flux concentrator, and in the case of a dislike flux concentrator, points radically to a center point of the flux concentrator or alternatively radically away from it.

* * * * *